(12) United States Patent
Sakakura et al.

(10) Patent No.: US 9,784,808 B2
(45) Date of Patent: Oct. 10, 2017

(54) MAGNETIC RESONANCE IMAGING APPARATUS AND MAGNET FOR MAGNETIC RESONANCE IMAGING APPARATUS

(71) Applicant: TOSHIBA MEDICAL SYSTEMS CORPORATION, Otawara-Shi, Tochigi (JP)

(72) Inventors: Yoshitomo Sakakura, Nasushiobara (JP); Kazuto Nogami, Nasushiobara (JP); Hidekazu Tanaka, Otawara (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 662 days.

(21) Appl. No.: 14/285,138

(22) Filed: May 22, 2014

(65) Prior Publication Data
US 2014/0253125 A1 Sep. 11, 2014

Related U.S. Application Data

(63) Continuation of application No. PCT/JP2013/062068, filed on Apr. 24, 2013.

(30) Foreign Application Priority Data

May 21, 2012 (JP) ................. 2012-116092

(51) Int. Cl.
*G01R 33/385* (2006.01)
*G01R 33/421* (2006.01)
(Continued)

(52) U.S. Cl.
CPC ..... *G01R 33/3856* (2013.01); *G01R 33/4215* (2013.01); *G01R 33/3804* (2013.01); *G01R 33/3815* (2013.01)

(58) Field of Classification Search
CPC ............ G01R 33/3856; G01R 33/4215; G01R 33/3804
See application file for complete search history.

(56) References Cited

U.S. PATENT DOCUMENTS 4,833,434 A 5/1989 Takechi
4,905,316 A 2/1990 Okamoto
(Continued)

FOREIGN PATENT DOCUMENTS

JP 5-269098 10/1993
JP 2011-194136 10/2011

OTHER PUBLICATIONS

Chinese retrial notice issued Nov. 3, 2016 in CN Patent Application No. 201380000800.7.
International Search Report for PCT/JP2013/062069 dated Jul. 2, 2013.
Written Opinion of the International Searching Authority dated Jul. 2, 2013.
(Continued)

*Primary Examiner* — Gregory H Curran
(74) *Attorney, Agent, or Firm* — Nixon & Vanderhye P.C.

(57) ABSTRACT

According to one embodiment, a magnetic resonance imaging apparatus includes an imaging unit and a shield. The imaging unit is configured to perform magnetic resonance imaging of an object by transmitting a radio frequency signal from a radio frequency coil while magnetic fields are formed by a gradient coil and a superconducting magnet respectively. The shield is configured to form a gradient magnetic field for the magnetic resonance imaging with the gradient coil and to prevent ingress of heat into the superconducting magnet.

15 Claims, 3 Drawing Sheets

(51) Int. Cl.
*G01R 33/3815* (2006.01)
*G01R 33/38* (2006.01)

(56) References Cited

U.S. PATENT DOCUMENTS

| | | | |
|---|---|---|---|
| 5,280,247 A | 1/1994 | DeMeester et al. | |
| 5,416,415 A | 5/1995 | Dorri et al. | |
| 5,539,367 A * | 7/1996 | Xu | G01R 33/421 |
| | | | 324/318 |
| 6,531,870 B2 | 3/2003 | Heid et al. | |
| 7,777,489 B2 | 8/2010 | Kawamoto | |
| 2002/0105329 A1* | 8/2002 | Heid | G01R 33/385 |
| | | | 324/318 |
| 2012/0146644 A1* | 6/2012 | Dietz | G01R 33/3802 |
| | | | 324/318 |

OTHER PUBLICATIONS

Second Office Action dated Nov. 6, 2015 in CN Patent Application No. 201380000800.7 and partial English translation therof.
"Principle, technique and quality assurance of MRI," China Science Publishing & Media Ltd., p. 174 (2004).
Final Rejection dated Apr. 20, 2016 in CN Patent Application No. 201380000800.7.
Notification of Transmittal of Translation of the International Preliminary Report on Patentability in PCT/JP2013/062068 dated Dec. 4, 2014.
Office Action dated Mar. 16, 2015 in CN Patent Application No. 201380000800.7.
First Japanese office action dated Apr. 25, 2017, in Patent Application No. JP 2013-091351.
Chinese retrial decision issued May 31, 2017, in Patent Application No. 201380000800.7.

* cited by examiner

MAGNETIC RESONANCE IMAGING APPARATUS AND MAGNET FOR MAGNETIC RESONANCE IMAGING APPARATUS

CROSS REFERENCES TO RELATED APPLICATIONS

This is a continuation of Application PCT/JP2013/62068, filed on Apr. 24, 2013.

This application is based upon and claims the benefit of priority from Japanese Patent Application No. 2012-116092, filed on May 21, 2012; the entire contents of which are incorporated herein by reference.

FIELD

Embodiments described herein relate generally to a MRI (magnetic resonance imaging) apparatus and a magnet for a magnetic resonance imaging apparatus.

BACKGROUND

The MRI apparatus is an image diagnostic apparatus which magnetically excites nuclear spins of an object set in a static magnetic field with an RF (radio frequency) signal having the Larmor frequency and reconstructs an image based on MR (magnetic resonance) signals generated due to the excitation.

In the MRI apparatus, eddy magnetic fields which arise due to the generation of gradient magnetic fields are tried to be reduced since eddy magnetic fields adversely affects affect imaging. Now, the technology to use an ASGC (Actively Shielded Gradient Coil) as a coil for gradient magnetic fields in order to suppress eddy magnetic fields has become mainstream. The ASGC is the gradient coil which has a cylindrical shield coil to suppress a leak magnetic field, outside of a cylindrical main coil for forming respective gradient magnetic fields in the X-axis, the Y-axis, and the Z-axis directions respectively.

It is an object of the present invention to provide a magnetic resonance imaging apparatus and a magnet for a magnetic resonance imaging apparatus which can form desired gradient magnetic fields with a simpler configuration.

PRIOR TECHNICAL LITERATURE

[Patent literature 1] JPA 2008-253593

DETAILED DESCRIPTION

In general, according to one embodiment, a magnetic resonance imaging apparatus includes an imaging unit and a shield. The imaging unit is configured to perform magnetic resonance imaging of an object by transmitting a radio frequency signal from a radio frequency coil while in a condition that magnetic fields are formed by a gradient coil and a super conducting magnet respectively. The shield is configured to form a gradient magnetic field for the magnetic resonance imaging with the gradient coil and to prevent ingress of heat into the superconducting magnet.

Further, according to another embodiment, a magnetic resonance imaging apparatus includes a superconducting magnet, a gradient coil, a radio frequency coil, and a shield. The superconducting magnet is configured to form a static magnetic field, for magnetic resonance imaging of an object, in an imaging area where the object is set. The radio frequency coil is configured to transmit a radio frequency signal to the imaging area. The shield is configured to form a gradient magnetic field, for magnetic resonance imaging, in the imaging area with the gradient coil and to prevent ingress of heat into the superconducting magnet.

Further, according to another embodiment, a magnet for a magnetic resonance imaging apparatus includes a magnet body and a shield. The magnet body has liquid helium and a superconducting coil in a casing. The shield is set inside the magnet body. A time constant of an eddy magnetic field of the shield is not less than 500 ms.

A magnetic resonance imaging apparatus and a magnet for a magnetic resonance imaging apparatus according to embodiments of the present invention will be described with reference to the accompanying drawings.

First Embodiment

Figure 1:
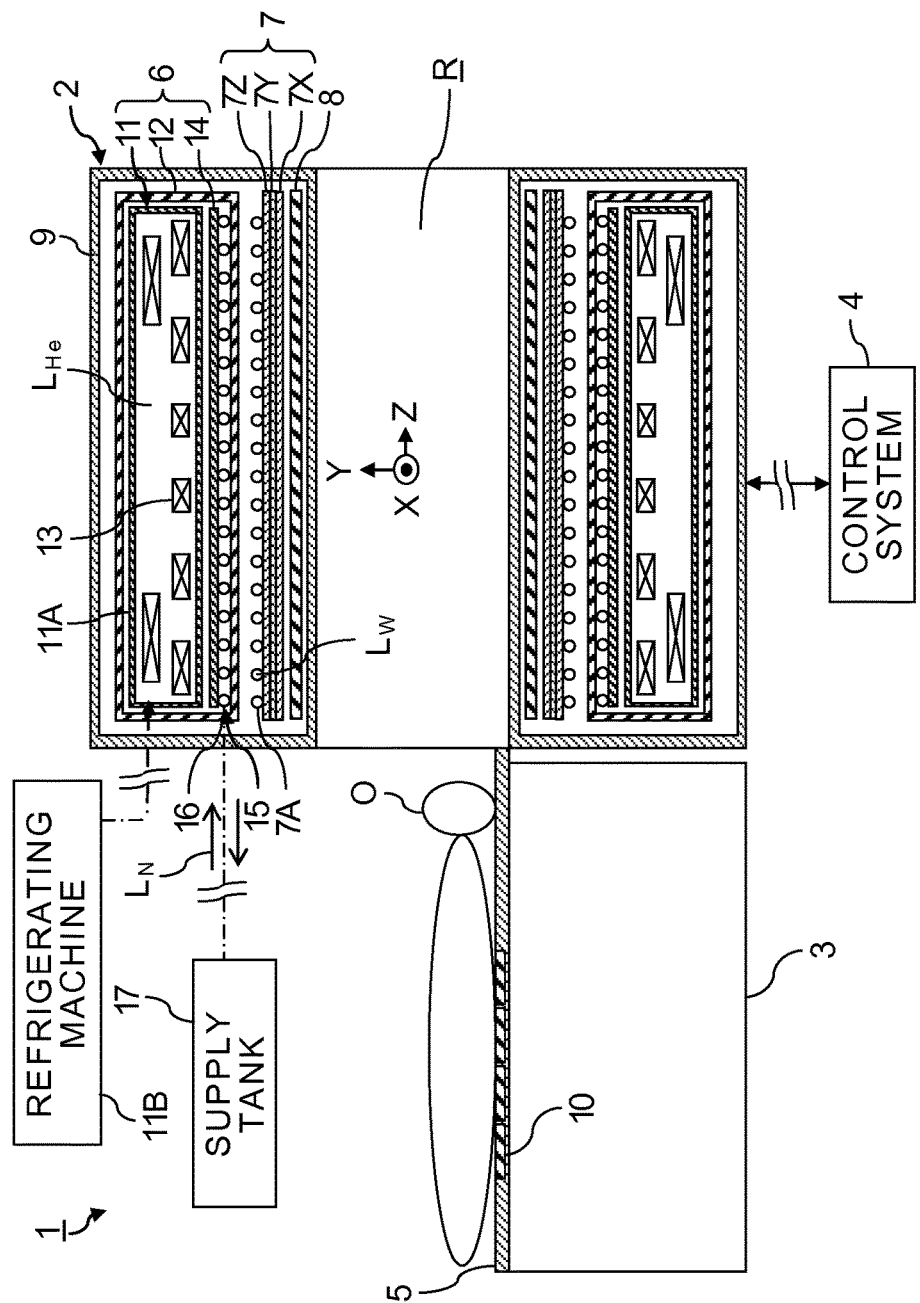
FIG. 1 is a longitudinal sectional view showing a configuration of a magnetic resonance imaging apparatus and a magnet for the magnetic resonance imaging apparatus according to the first embodiment of the present invention.

FIG. 1 is a longitudinal sectional view showing a configuration of a magnetic resonance imaging apparatus and a magnet for the magnetic resonance imaging apparatus according to the first embodiment of the present invention.

A magnetic resonance imaging apparatus 1 has a gantry 2, a bed 3, and a control system 4. A bore is formed in the gantry 2 and an object O which is set on a top plate 5 of the bed 3 can be sent into the bore. Then, an imaging area R is formed in the bore of the gantry 2.

Inside the gantry 2, a cylindrical superconducting magnet 6, a cylindrical gradient coil 7, and a cylindrical WB (whole body) coil 8 are coaxially arranged from the outer side towards the inner side. That is, the superconducting magnet 6, the gradient coil 7, and the WB coil 8 are covered by a casing 9 of the gantry 2.

Moreover, arbitrary RF coils for receiving MR signals are arranged in the imaging area R. As an RF coil for receiving MR signals, various coils are used depending on an imaging part and imaging purposes. For example, a body coil which is put on the body surface side of the object O, a spine coil which is put on the back side of the object O and the like are typical RF coils for receiving MR signals. FIG. 1 shows an example of spine coil, attached on the top plate 5 of the bed 3, as a reception RF coil 10.

The WB coil 8 is an RF coil for mainly transmitting RF signals to the imaging area R. However, it may be used to receive MR signals.

The gradient coil 7 is a coil to form a spatial gradient magnetic field in the imaging area R where the object O is set. Therefore, the gradient coil 7 is made up by a coil 7X for the X-axis which forms a gradient magnetic field in the X-axis direction, a coil 7Y for the Y-axis which forms a gradient magnetic field in the Y-axis direction and a coil 7Z for the Z-axis which forms a gradient magnetic field in the Z-axis direction A number of pipes 7A to flow cooling mediums are provided outside of the gradient coil 7. As a cooling medium of the gradient coil 7, liquid water $L_W$ is used typically. The pipes 7A are connected to a supply tank of the cooling media, such as liquid water $L_W$. However, the configuration thereof is known, and therefore, their illustration and explanation are omitted.

The superconducting magnet 6 is an element to form a static magnetic field, for MR imaging of the object O, in the imaging area R where the object O is set. The superconducting magnet 6 is composed by a magnet body 11 put in a casing 12. The magnet body 11 is composed by liquid helium $L_{He}$ and multiple superconducting coils 13 put in a case 11A. Moreover, the case 11A in which the liquid helium $L_{He}$ is encapsulated is cooled by a refrigerating machine 11B. Then, the superconducting coil 13 is cooled to about 4K by the liquid helium $L_{He}$. Thereby, the wire rods of the superconducting coil 13 get the property of superconductivity. As a result, the static magnetic field is formed in the imaging area R inside the gantry 2 and the superconducting magnet 6.

The control system 4 is a system to control elements including the superconducting magnet 6, the gradient coil 7, the WB coil 8, the RF coils for receiving MR signals and the bed 3. Thus, MR imaging of the object O can be performed by transmitting RF signals from the RF coil in the condition that the gradient magnetic field and the static magnetic fields are respectively formed by the gradient coil 7 and the superconducting magnet 6 under the control by the control system 4.

Furthermore, a shield 14 is provided inside of the magnet body 11. That is, as shown in FIG. 1, the shield 14 can be provided inside of the casing 12 which composes the superconducting magnet 6 together with the magnet body 11. The shield 14 has a role to form the gradient magnetic fields for MR imaging in the imaging area R in collaboration with the gradient coil 7 and to prevent heat from going into the superconducting magnet 6.

In particular, the shield 14 is configured to form the gradient magnetic field for MR imaging in collaboration with the gradient coil 7 by canceling out at least the magnetic field which arises from the gradient coil 7 to the superconducting magnet 6 side. In other words, the shield 14 functions as a magnetic field shield to cancel out a magnetic field which generates outside of the gradient coil 7 and as a heat shield to prevent an ingress of heat into the superconducting magnet 6.

Note that, the time constant of the eddy magnetic field generated in the shield 14 is determined to be not less than that required for MR imaging. Then, the shield 14 can be made of a metal plate whose time constant of eddy magnetic field is not less than 500 ms. For example, when the shield 14 is made of a cylindrical metal plate, the shield 14 functions as a passive coil which does not need an input-output current. If the shield 14 is considered as one of the elements of the gradient coil 7, it can be said that a PSGC (Passively Shielded Gradient Coil) system is formed by both of the shield 14 and the gradient coil 7.

A cylindrical aluminum plate of which thickness is not less than 10 mm and a cylindrical copper plate of which thickness is not less than 3 mm are given as examples of the metal plate of which time constant of eddy magnetic field is not less than 500 ms. For example, the time constant of Al (1100) of which thickness is 12 mm is 537 ms. Meanwhile, the time constant of Cu (1020) of which thickness is 3 mm is 634 ms.

When the shield 14 as described above is provided inside of the magnet body 11, an eddy magnetic field which cancels magnetic fields formed outside of the gradient coil 7 are generated in the shield 14. For this reason, the intended gradient magnetic fields for MR imaging can be formed as a result of the superposition between gradient magnetic fields formed by the gradient coil 7 and the eddy magnetic field generated in the shield 14.

Therefore, conditions of the winding of the gradient coil 7 and the structure of the shield 14 are determined so that desired gradient magnetic fields appropriate for MR imaging are formed. For example, the number of the windings of the gradient coil 7 and the diameter or radius of the shield 14 can be determined so that desired gradient magnetic fields are formed. The pattern of the windings of the gradient coil 7 can be also determined so that desired gradient magnetic fields are formed.

The appropriate number of the winding windings of the gradient coil 7 is inversely proportional to RS2/RG2 which is a ratio between a square of radius RS of the shield 14 and a square of radius RG of the gradient coil 7. On the other hand, the shield 14 is provided inside of the casing 12 which composes the superconducting magnet 6. For this reason, the radius RS of the shield 14 can be made larger than the internal radius of the superconducting magnet 6. As a result, the number of the winding windings of the gradient coil 7 can be reduced.

For example, in the conventional ASGC, the shield coil to cancel out a leak magnetic field from the main coil has to be put between the superconducting magnet and the main coil. For this reason, in order to meet the need to downsize a gantry size, the shield coil inevitably approaches the main coil. Therefore, the internal diameter of the shield coil of the ASGC is extremely smaller than the internal diameter of the shield 14. Conversely, the internal diameter of the shield 14 can be made larger than the internal diameter of the shield coil of the ASGC.

As a result, the number of the winding windings of the gradient coil 7 can be made less than the number of the winding windings of the main coil of the conventional ASGC. That is, since magnetic fields of the gradient coil 7 are canceled out by the shield 14 placed farther than the shield coil, a strength of magnetic field which should be formed by the gradient coil 7 can be reduced. Therefore, the structure of the gradient coil 7 can be made simpler than that of the ASGC and electric power which should be supplied to the gradient coil 7 can be also reduced compared with the electric power which should be supplied to the main coil of the ASGC.

The gradient coil 7 is cooled by a cooling medium, such as cooling water, which flows through the pipes 7A. However, depending on the characteristic and installation environments of the magnetic resonance imaging apparatus 1, it sometimes becomes necessary to cool down more to prevent vaporization of the liquid helium $L_{He}$ encapsulated in the case 11A of the magnet body 11. In order to prevent vaporization of the liquid helium $L_{He}$, the temperature in the case 11A must be kept at 4K.

For example, the temperature in the bore of the gantry 2 usually reaches about 300K. Then, a cooling system 15 can be provided with the superconducting magnet 6 to cool the outside of the shield 14, i.e., the magnet body 11 side, down to about 50K.

As a concrete example, pipes 16 for a cooling medium can be provided in the gradient coil 7 side of the shield 14 as shown in FIG. 1. In order to cool the gradient coil 7 side of the shield 14 down to 50K, it is practical to use the liquid nitrogen $L_N$ as a cooling medium to be supplied in the pipes 16. Accordingly, the pipes 16 are connected with a supply tank 17 of the liquid nitrogen $L_N$. Thus, the cooling system 15 is configured as a circulation system of the liquid nitrogen $L_N$ in which the liquid nitrogen $L_N$ discharged from the supply tank 17 flows through the pipes 16 and returns to the supply tank 17 again. Thereby, an ingress of heat from the gradient coil 7 side of the shield 14 to the magnet body 11 side can be deterred.

Figure 2:
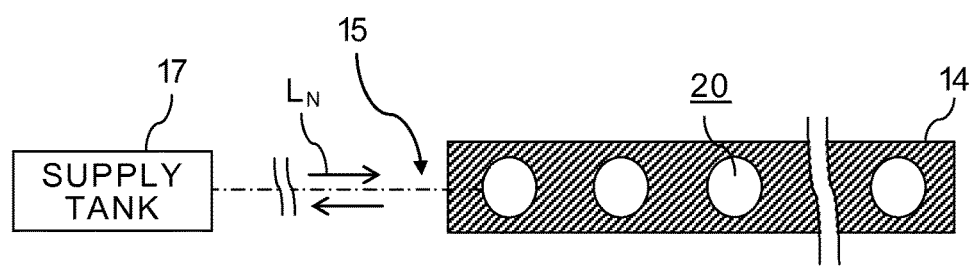
FIG. 2 is a longitudinal sectional view of the shield showing a modification of the cooling system shown in FIG. 1.

FIG. 2 is a longitudinal sectional view of the shield 14 showing a modification of the cooling system 15 shown in FIG. 1.

As shown in FIG. 2, channels 20 for a cooling medium can be also formed inside the shield 14. In this case, the cooling medium, such as liquid nitrogen $L_N$, is supplied from the supply tank 17 into through holes which form the channels 20 inside of the shield 14.

The shield 14 with which the pipes 16 are fixed and the shield 14 in which the channels 20 are formed, as illustrated in FIG. 1 and FIG. 2 as examples, can be manufactured using arbitrary manufacturing methods such as the diffusion bonding technique. By providing the cooling system 15 with the superconducting magnet 6, the typical refrigerating machine 11B, used to cool the case 11A in which the liquid helium $L_{He}$ is encapsulated, becomes possible to be used as it is On the other hand, instead of providing the cooling system 15, or in addition to providing the cooling system 15, the capability of the refrigerating machine 11B itself may be determined appropriately. That is, the liquid helium $L_{He}$ and the case 11A can be cooled by using the refrigerating machine 11B which can maintain the temperature in the case 11A about at 4K.

That is, the magnetic resonance imaging apparatus 1 described above is an apparatus configured to use the eddy magnetic field arising in the shield 14, which is built in the superconducting magnet 6 to prevent an ingress of heat, to cancel out leak magnetic fields from the gradient coil 7.

Conventionally, from the standpoint that a magnetic field possibly arising inside the superconducting magnet 6 adversely affects imaging, countermeasures to minimize a magnetic field as much as possible inside the superconducting magnet 6 have been taken. Therefore, up to now, a gradient coil has been designed so that gradient magnetic fields necessary for imaging can be formed by the main coil and the shield coil of an ASGC, or only by the main coil of an NSGC (Non Shield Gradient Coil) which has no shield coil.

On the other hand, in the magnetic resonance imaging apparatus 1, the eddy magnetic field which arises in the shield 14 provided inside of the superconducting magnet 6 is not canceled but positively used. Specifically, an eddy magnetic field similar to one generated in the shield coil of an ASGC is generated in the shield 14.

For this reason, in the magnetic resonance imaging apparatus 1, it becomes possible to obtain a gradient magnetic field strength similar to that by the conventional ASGC with a lower electric power. That is, the generation efficiency of gradient magnetic field in the ASGC is reduced compared to the NSGC because the leak magnetic field from the main coil of the ASGC is canceled out by the shield coil. As a result, the ASGC requires a gradient magnetic field power supply which requires a larger electric power compared to that in the NSGC in order to obtain the intended gradient magnetic field strength. However, in recent years, the MRI apparatus of 3 [T], allowing high resolution and high speed imaging, is prevailing because of its improved SNR (signal to noise ratio) better than that in the MRI apparatus of 1.5 [T]. Consequently, the power which is needed for the gradient magnetic field power supply is increasing.

Accordingly, composing the magnetic resonance imaging apparatus 1 described above as a 3 [T] apparatus can reduce the power necessary for the gradient magnetic field power supply. In fact, the gradient coil 7 which functions as a PSGC together with the shield 14 was designed with a size similar to that of a conventional and typical sized main coil of ASGC. Then, it was affirmed that the electric power consumed by the gradient magnetic field power supply could be reduced by about 40%.

Furthermore, the shield coil of ASGC is not necessary in the magnetic resonance imaging apparatus 1. Therefore, enlarging the bore is possible.

Second Embodiment

Figure 3:
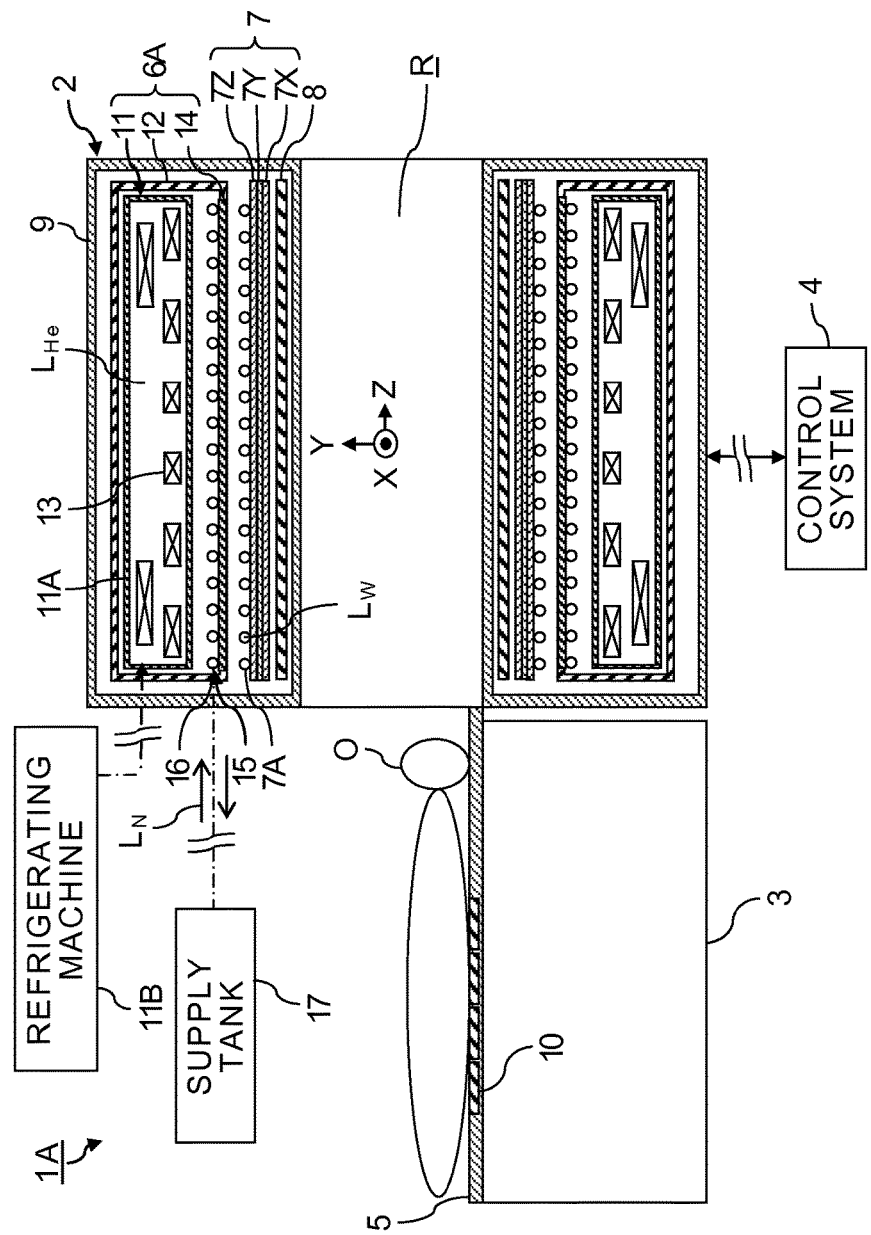
FIG. 3 is a longitudinal sectional view showing a configuration of a magnetic resonance imaging apparatus and a magnet for the magnetic resonance imaging apparatus according to the second embodiment of the present invention.

FIG. 3 is a longitudinal sectional view showing a configuration of a magnetic resonance imaging apparatus and a magnet for the magnetic resonance imaging apparatus according to the second embodiment of the present invention.

A magnetic resonance imaging apparatus 1A and a superconducting magnet 6A for the magnetic resonance imaging apparatus 1A shown in FIG. 3 are different from the magnetic resonance imaging apparatus 1 and the superconducting magnet 6A for the magnetic resonance imaging apparatus 1 shown in FIG. 1, in the point that a part of the casing 12 composing the superconducting magnet 6A is formed by the shield 14. The other configurations and effects are substantially same as the magnetic resonance imaging apparatus 1 and the superconducting magnet 6 for the magnetic resonance imaging apparatus 1 shown in FIG. 1. Therefore, the same signs are attached to the same elements and explanation about the same elements is omitted.

In the superconducting magnet 6A for magnetic resonance imaging apparatus 1A, the inside of the casing 12, which is the surface in the gradient coil 7 side, functions as the shield 14. Therefore, the surface in the gradient coil 7 side of the casing 12 which composes the superconducting magnet 6A is made of a cylindrical aluminum or copper metal plate of which time constant of an eddy magnetic field is not less than 500 ms.

In addition, the cooling system 15 may be provided with the shield 14, as needed. The FIG. 3 shows the example that the pipes 16 for the liquid nitrogen $L_N$ which constructs the cooling system 15 are arranged on the magnet body 11 side of the shield 14.

According to the magnetic resonance imaging apparatus 1A and the superconducting magnet 6A for the magnetic resonance imaging apparatus 1A, which have such configurations, in the second embodiment effects similar to those in the magnetic resonance imaging apparatus 1 and the superconducting magnet 6 for the magnetic resonance imaging apparatus 1 in the first embodiment can be obtained. In addition, the number of elements can be reduced.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, an ASGC may be used as the gradient coil 7 in each embodiment described above. That is, the shield 14 can be provided instead of providing a shield coil of ASGC or in addition to a shield coil of ASGC. Each ASGC includes respective main coils, for the X-axis, the Y-axis and the Z-axis, in order to generate gradient magnetic fields, and respective shield coils, for the X-axis, the Y-axis and the Z-axis, in order to cancel out leak magnetic fields, in the X-axis direction, the Y-axis direction and the Z-axis direction, from the main coils. Therefore, when an ASGC is used as the gradient coil 7, leak magnetic fields from the main coils of the ASGC are cancelled by both the shield coils of the ASGC and the shield 14.

What is claimed is:

1. A magnetic resonance imaging apparatus comprising:
    an imaging unit configured to perform a magnetic resonance imaging of an object by transmitting a radio frequency signal from a radio frequency coil when magnetic fields are formed by a gradient coil and a superconducting magnet respectively; and
    a shield configured to conduct eddy currents which generate an eddy magnetic field and to prevent ingress of heat into the superconducting magnet, the eddy magnetic field being superposed with a magnetic field generated by the gradient coil having a pattern of windings determined such that a gradient magnetic field for magnetic resonance imaging is formed including the eddy magnetic field.

2. A magnetic resonance imaging apparatus comprising:
    a superconducting magnet configured to form a static magnetic field, for magnetic resonance imaging of an object, in an imaging area where the object is set;
    a gradient coil;
    a radio frequency coil configured to transmit a radio frequency signal to the imaging area; and
    a shield configured to conduct eddy currents which generate an eddy magnetic field and to prevent ingress of heat into the superconducting magnet, the eddy magnetic field being superposed with a magnetic field generated by the gradient coil having a pattern of windings determined such that a gradient magnetic field for magnetic resonance imaging is formed including the eddy magnetic field.

3. A magnetic resonance imaging apparatus of claim 1, wherein said shield is configured to form the gradient magnetic field with the gradient coil by canceling at least a magnetic field generated, from the gradient coil, at a side of the superconducting magnet.

4. A magnetic resonance imaging apparatus of claim 1, wherein said shield is made of a metal plate whose eddy magnetic field time constant is not less than 500 ms.

5. A magnetic resonance imaging apparatus of claim 4, wherein said shield is made of a tubal aluminum plate having a thickness not less than 10 mm or a tubal copper plate having a thickness not less than 3 mm.

6. A magnetic resonance imaging apparatus of claim 1, wherein said shield is made of a metal plate whose eddy magnetic field time constant is not less than a time constant required for magnetic resonance imaging.

7. A magnetic resonance imaging apparatus of claim 1, wherein said shield is set as a passive coil which does not need an input and output current.

8. A magnetic resonance imaging apparatus of claim 1, wherein said shield is set inside a casing constituting the superconducting magnet.

9. A magnetic resonance imaging apparatus of claim 1, wherein said shield is configured to form a part of a casing constituting the superconducting magnet.

10. A magnetic resonance imaging apparatus of claim 1, wherein said shield has a structure determined with a condition of the windings of the gradient coil so as to form an intended gradient magnetic field appropriate for magnetic resonance imaging.

11. A magnetic resonance imaging apparatus of claim 10, wherein said shield has a diameter or a radius determined with a number of the windings of the gradient coil so as to form the intended gradient magnetic field.

12. A magnetic resonance imaging apparatus of claim 1, wherein said shield has a pipe for conducting a cooling media on a side of the gradient coil.

13. A magnetic resonance imaging apparatus of claim 1, wherein said shield has a channel for conducting a cooling media inside the shield.

14. A magnetic resonance imaging apparatus of claim 1, wherein said shield is a heat shield to prevent ingress of heat into the superconducting magnet.

15. A magnet for a magnetic resonance imaging apparatus comprising:
    a magnet body having liquid helium and a superconducting coil in a casing; and
    a shield set inside said magnet body and having an eddy magnetic field time constant that is not less than 500 ms, the eddy magnetic field being superposed with a magnetic field generated by the gradient coil having a pattern of windings determined such that a gradient magnetic field for magnetic resonance imaging is formed including the eddy magnetic field.

* * * * *